WIDE-BAND AUTOMATIC GAIN-CONTROLLED AMPLIFIER

Filed June 28, 1962 2 Sheets-Sheet 1

Inventors
WOLFGANG ULMER
EDUARD SEIBT
By Toulmin & Toulmin
Attorneys

WIDE-BAND AUTOMATIC GAIN-CONTROLLED AMPLIFIER

Filed June 28, 1962 2 Sheets-Sheet 2

Inventors
WOLFGANG ULMER
EDUARD SEIBT
By Toulmin & Toulmin
Attorneys

United States Patent Office
3,222,609
Patented Dec. 7, 1965

3,222,609
WIDE-BAND AUTOMATIC GAIN-CONTROLLED AMPLIFIER

Wolfgang Ulmer and Eduard Seibt, Munich, Germany, assignors to Siemens & Halske Aktiengesellschaft, Berlin, Germany, a German company
Filed June 28, 1962, Ser. No. 206,080
Claims priority, application Germany, June 30, 1961, S 74,572
6 Claims. (Cl. 330—29)

This invention relates to multi-stage variable-gain transistor amplifiers. If the gain of a transistor amplifier is altered by changing the working point of one or more transistors, then the resulting change in transistor input and output impedance alters the response curve of the amplifier. This cannot be tolerated in many wide-band amplifiers and sometimes also in narrow-band amplifiers.

It is an object of the invention to make the frequency characteristic of a variable-gain multi-stage transistor amplifier less dependent on variations of the gain.

The invention consists in a multi-stage transistor amplifier having variable attenuators connected between individual stages, wherein the attenuation produced by said variable attenuators is automatically varied in dependence on the output level, and wherein the arrangement is such that, as the output level increases, the attenuation of the attenuator last in the direction of transmission is first increased to its maximum, whereafter the attenuation of the preceding attenuator is increased.

Methods of performing the invention will now be described with reference to the accompanying diagrammatic drawings, in which.

Figure 1:
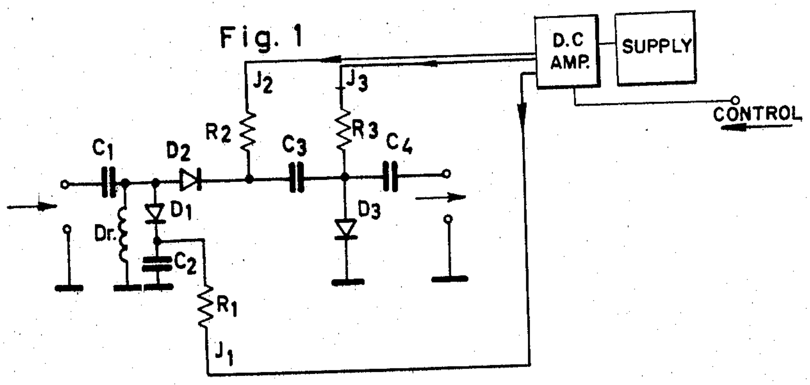
FIGURE 1 is a circuit diagram of a known variable attenuator.

Referring to FIGURE 1 there is shown an attenuator in having non-linear variable resistance elements in the form of diodes; however, it is to be understood that if only low-speed control is required, such elements can take the form of thermistors or the like. The three non-linear resistance elements form a $\pi$-section and, as a result of the provision of blocking capacitors C1, C2, C3 and C4 as well as a choke D*r*, the D.C. control currents, which are applied to the diodes via series resistances R1, R2 and R3, are kept separate from the signal currents. The condensers C1, C3 and C4 simultaneously perform the function of coupling condensers connecting the amplifier stage in front of the attenuator with the one following it. If the direct current through one of the diodes is increased, then its resistance value is reduced. If the current passed by the diode becomes smaller, then its resistance becomes larger. The three variable-resistance diodes D1, D2 and D3 are so controlled by the direct currents which they carry that an increase in attenuation is produced by increasing the resistance of the diode D2 and reducing the resistances of the diodes D1 and D3. However, it is expedient in this connection not to employ the whole available resistance range for control of the attenuation. Rather, it is recommended that a resistance of lower value, e.g. 20 ohms, be connected in series with the diode D1 and, above all, that in parallel with the diode D2 a resistance of considerably higher value e.g. 200 ohms, be connected by means of an A.C. coupling. A resistance similar to that in series with the diode D1 may be connected in series with the diode D3.

If the amplifier stage following the attenuator is a transistor amplifier connected in a grounded-base circuit, the diode D3 may be omitted.

The direct current J1 through the diode D1 and the direct current J2 through the diode D2 may be varied so that the sum of these currents is a constant. However, a somewhat larger control range or a rather better frequency characteristic can be obtained if J1 and J2 are chosen in accordance with the condition that J1 is equal to zero as long as J2 is not equal to zero and vice versa. This is of particular advantage if, as mentioned before, resistances are connected in series with the diode D1 and in parallel with the diode D2 so as to provide a lower limit on the range of variation in the A.C. impedance of the shunt arm and an upper limit on the range of variation in the series arm.

Particularly when using several variable attenuators in cascade, it is quite sufficient to provide only one variable non-linear resistance element in each attenuator.

Figure 2:
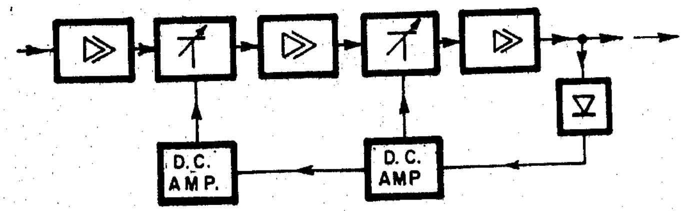
FIGURE 2 is a block diagram of an amplifier in accordance with the invention.

For wide-band amplifiers having, e.g., a band-width of about 40 megacycles per second and a permissible deviation in frequency response of about 0.5 decibel, an attenuator of this type should preferably have a control range of about 10 to 15 decibels. Should the amplifier have a wider control range, then it is advantageous to adopt the approach as indicated in FIGURE 2, whereby several attenuators, each of which preferably contains only one variable resistance element, are provided, these being connected between preferably two-stage transistor amplifiers. In narrow-band amplifiers, the attenuators may be given a wider control range. The gain of the amplifier stages situated between successive attenuators is preferably approximately equal to the maximum attenuation of the preceding attenuator in each case.

In theory, the individual attenuators should be varied simultaneously. However, for a wide-band amplifier having, e.g., a frequency range of 50–90 megacycles per second, it is advantageous to carry out sequential control in such a way that, when the signal input level increases, first of all the control of the last attenuator of the whole amplifier in the direction of transmission is varied until this attenuator introduces its maximum attenuation. With a further increase in the input signal level, this last attenuator maintains its maximum value and the control of the attenuator immediately preceding it comes into operation, likewise until it reaches its maximum attenuation. If the input level increases still further, both these two attenuators remain at their maximum values and the attenuator control next in immediate preceding order comes into operation in the same manner.

This preferential operation which can be carried on indefinitely as long as there are sufficient attenuator controls, yields the great advantage for wide-band amplifiers that the frequency characteristic of the amplifier within the control range is favorably affected. This is because it is possible to design the individual attenuators to have a frequency response characteristic for the minimum value of attenuation which is practically identical with that for the maximum value of the attenuation. It is only in the intermediate control region that a slight alteration in the frequency response characteristic occurs. Since with sequential control, only one attenuator can exhibit this deviation in frequency characteristic at any one time, the use of a great many control stages making up a very wide control range enables the deviations in the frequency characteristic of the whole amplifier to be kept very low.

Figure 3:
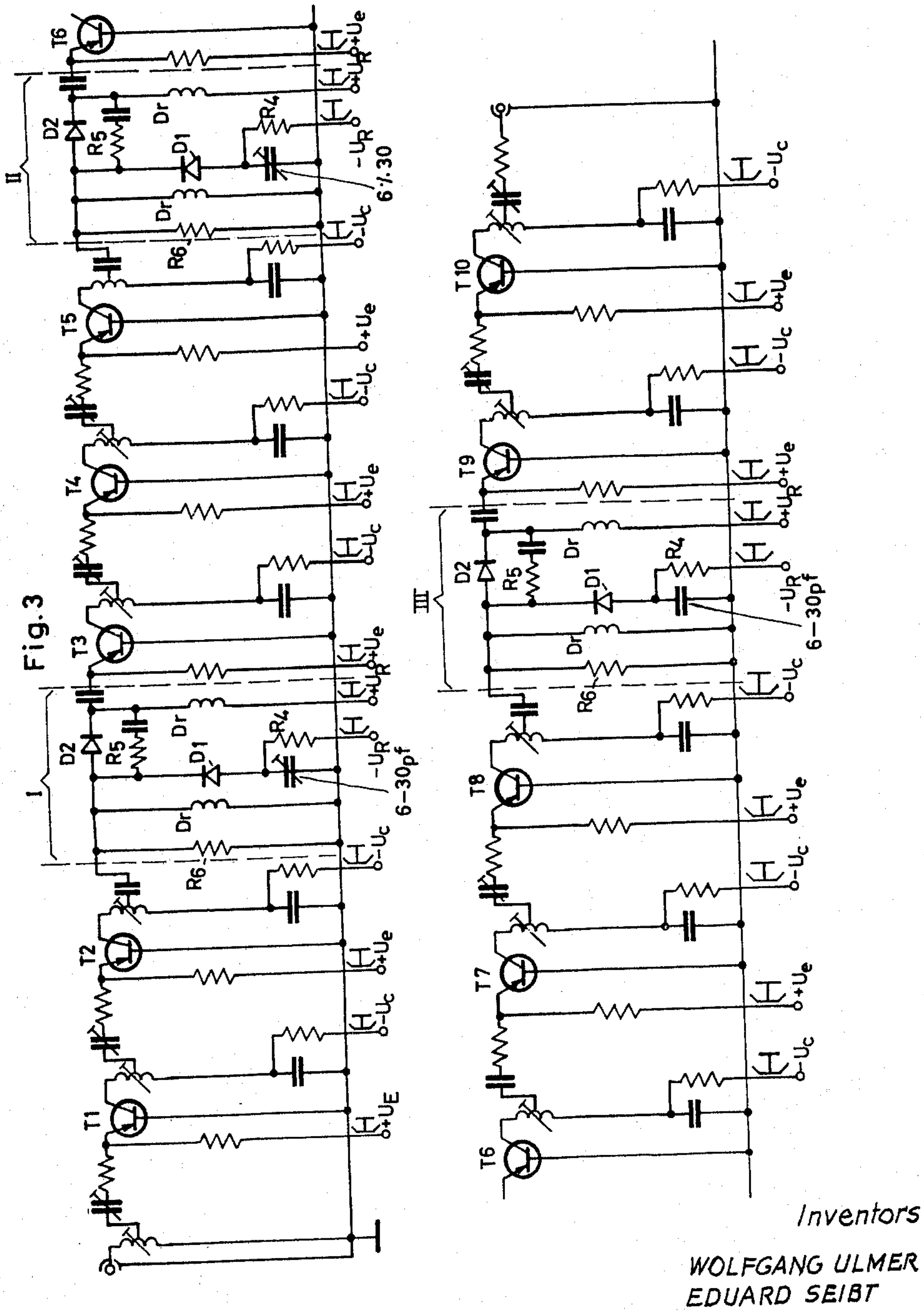
FIGURE 3 is a circuit diagram of an amplifier in accordance with the invention.

FIGURE 3 illustrates a circuit in which a 10-stage wide-band transistor amplifier having a frequency range of e.g., 50–90 megacycles per second, is provided with three variable attenuators. In this figure, the attenuators are in each case delineated by dashed lines and carry corresponding designations I, II and III. The individual amplifier stages are in each case of grounded-base configuration to enable the circuits of the individual attenuators to be simplified by the omission of the second shunt-arm resistance D3 (compare FIGURE 1). The high frequency coupling for each stage of the wide-band amplifier comprises a coil with a coupling capacitor and a resistor in series. The means whereby the previously mentioned adjustment of the frequency response characteristic of each attenuator is effected comprises an adjustable capacitor in series with the diode D1 which, together with the diode D1 in each attenuator forms the attenuator shunt arm. Preferably, the capacitor is adjustable between 6 and 30 picafarads. The limiting resistor which is connected in series with the diode D1 to provide the lower limit of the attentuator range is the resistor R4 and preferably is of value of about 20 ohms so that the control current through diode D1 is limited accordingly. Finally, the upper limit of the attenuation range of each attenuator is determined by the series combination of resistor R5 and a D.C. blocking capacitor which are together arranged in parallel with the diode D2 in each attenuator, resistor R5 preferably having a value of approximately 200 ohms. In the embodiment illustrated in FIGURE 3 the range of each attenuator is also partially determined by a resistor R6, of, for example, 200 ohms, which is connected across the input lines of each attenuator.

The control currents for the diodes D1 and D2 are supplied in the manner already described, i.e., J1 is equal to 0 as long as J2 is not equal to 0 and J2 is equal to 0 as long as J1 is not equal to 0. The directions of current flow are in opposition for the particular polar arrangement chosen for the diodes, this being indicated by —*Ur* and +*Ur* in the circuit diagram of FIGURE 3.

The application of the control voltages, particularly taking into account the preferential sequence existing between the attenuators I, II and III, may be so arranged that portion of the output voltage of the amplifier is rectified and fed back in parallel to three control voltage stages. Each of these control voltages stages is appointed a fixed voltage level from the rectified voltage, which rises from stage to stage, at which voltage level the stage will come into operation. In addition, each stage should be so formed that up to the point of becoming operative, the shunt arm resistance of its corresponding attenuator is driven high and the series resistance low, the appropriate change in this condition being made on its becoming operative.

Figure 4:
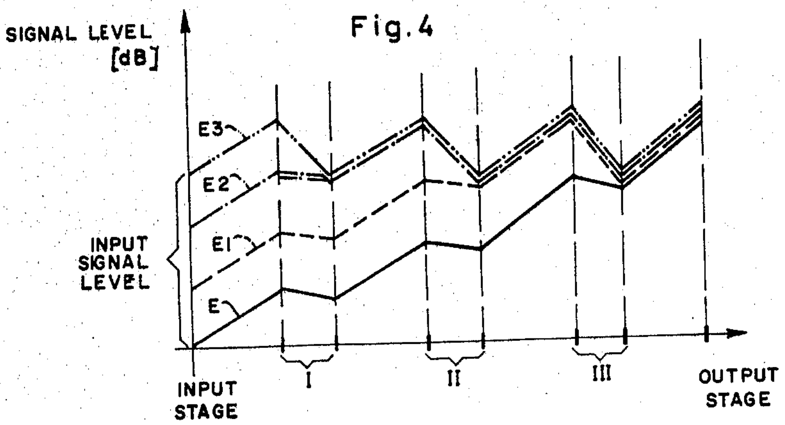
FIGURE 4 shows the signal level at various stages in the amplifier illustrated in FIGURE 3.

Throughout the amplifier shown in FIGURE 3, a change in level takes place as illustrated schematically in FIG. 4. Four cases of different input voltage are represented. The full-line curve E is for the case in which every control stage is at its minimum attenuation, i.e., that the input signal is still below the value at which control starts to take place. At a somewhat higher input signal level, the characteristic takes the form illustrated at E1, this being for input signals which fall within the control range of the attenuator III. For still higher signal input levels the characteristics take the form illustrated at E2 and E3, respectively.

What we claim as our invention and desire to Secure by Letters Patent of the United States is:

1. Automatic gain-controlled wide-band amplifier comprising: a plurality of transistor amplifier stages; a plurality of variable attenuators each having a pair of input and a pair of output terminals respectively connected to the output of one of said stages and to the input of the following stage; a first non-linear element in each attenuator connected from one input terminal thereof to one output terminal thereof; a first capacitor and a first limiting resistor connected in series with one another and together connected in parallel across said first element in each attenuator; a second non-linear element and a second capacitor connected in series with one another and together connected across the input terminals of each attenuator; a second limiting resistor connected across the input terminals of each attenuator, and control means connected between the output of the last amplifier stage and each attenuator to control the impedance of the first and second non-linear elements in each attenuator so as to increase from its minimum to its maximum the attenuation of each successive attenuator from the last to the first in the direction of transmission with increasing signal level, the minimum and maximum attenuation of each attenuator being substantially determined by said limiting resistors and said first and second capacitors in each attenuator being such that the frequency response of each attenuator is substantially the same at maximum and minimum attenuation.

2. In a wide-band amplifier a combination of: a plurality of amplifier stages, a variable attenuator connected between the output and input of each adjacent pair of said stages, a first non-linear element in each attenuator series-connected between the preceding and following amplifier stages, a first capacitor and a first limiting resistor connected in series with one another and together connected in parallel across said first element in each attenuator, a second non-linear element and a second capacitor together connected as a shunt arm in each attenuator, a second limiting resistor in each attenuator having one side connected to the junction between said second element and said second capacitor, and means for applying a D.C. control signal to the other end of said second resistor and to one side of said first element for controlling the impedance of said elements and the attenuation of each attenuator within a range of attenuation substantially determined by said limiting resistors.

3. A wide-band automatic gain-controlled transistor amplifier comprising: a plurality of grounded-base transistor amplifier stages; a variable attenuator connected between the output and input of each adjacent pair of said stages; a first crystal diode, a first capacitor and a first limiting resistor in each attenuator, the first capacitor and first limiting resistor being connected in series with one another and being together connected in parallel with said first diode, and said diode, capacitor and resistor together forming a series arm in each attenuator; a second crystal diode and a second capacitor in each attenuator, said second diode and said second capacitor being connected in series with one another and together forming a shunt arm in each attenuator; a second limiting resistor in each attenuator having one side connected to the junction between said second diode and said second capacitor; a third limiting resistor shunt-connected in each attenuator, the values of said resistors determining the attenuating range of each attenuator and the values of said capacitors being such that the frequency response of each attenuator is substantially the same at each extreme of said attenuation range; and signal level detecting means connected from the output of the last one of said stages to the other side of said second resistor and to one side of said first diode in each attenuator for increasing the attenuation of each attenuator in accordance with the output from said last stage, the attenuation introduced by the attenuator last in the direction of transmission being increased from its minimum to its maximum with increasing signal level and the attenuation introduced by each successive preceding attenuator being increased from its minium to its maximum with further increase in signal level.

4. A wide-band automatic gain-controlled transistor amplifier comprising: a plurality of grounded-base transistor amplifier stages; a variable attenuator connected between the output and input of each adjacent pair of said stages; a first crystal diode, a first capacitor and a first limiting resistor in each attenuator, the first capacitor and first limiting resistor being connected in series with one another and being together connected in parallel with said first diode, and said diode, capacitor and resistor together forming a series arm in each attenuator; a second crystal diode and a second capacitor in each attenuator, said second diode and said second capacitor being connected in series with one another and together forming a shunt arm in each attenuator; a second limiting resistor in each attenuator having one side connected to the junction between said second diode and said second capacitor; a third limiting resistor shunt-connected in each attenuator, the values of said first and second resistors in each attenuator substantially determining the maximum attenuation of the attenuating range of that attenuator and the value of said third resistor substantially determining the minimum attenuation, the attenuating range of each attenuator being substantially equal to the gain of the preceding one of said stages and being between 10 and 15 decibels, and the values of said capacitors being such that the frequency response of each attenuator is substantially the same at each extreme of said attenuation range; and signal level detecting means connected from the output of the last one of said stages to the other side of said second resistor and to one side of said first diode in each attenuator for increasing the attenuation of each attenuator in accordance with the output from said last stage, the attenuation introduced by the attenuator last in the direction of transmission being increased from its minimum to its maximum with increasing signal level and the attenuation introduced by each successive preceding attenuator being increased from its minimum to its maximum with further increase in signal level.

5. In an electronic amplifier for the controlled amplification of a wide-band A.C. signal, the combination of: a first fixed gain transistor amplifying stage having an output terminal; a second fixed gain transistor amplifying stage having an input terminal having input and output; a variable attenuator having input and output terminals; means connecting a control signal from the output terminal of the second stage to the variable attenuator; a first coupling capacitor connecting the output terminal of said first stage to the input terminal of said attenuator; a second coupling capacitor connecting the output terminal of said attenuator to the input terminal of said second stage; an electrical ground line common to the first stage, the second stage and the attenuator; a first crystal diode in the attenuator connected from the input terminal to the output terminal thereof; a first limiting resistor and a first capacitor connected in series in the attenuator between the input and output terminal thereof; a second crystal diode and a second capacitor in the attenuator connected in series with one another and together connected from the attenuator input terminal to the ground line; a second limiting resistor in the attenuator having one side connected to the junction of said second diode and said second capacitor; a third limiting resistor in the attenuator connected from the input terminal thereof to the ground line; a first choke for the A.C. signal in the attenuator connected from the input terminal thereof to the ground; a second choke for the A.C. signal in the attenuator having one side connected to the output terminal thereof; and current supply means connected to the other side of said second limiting resistor and to the other side of said first A.C. choke for independently controlling direct current flow in each of said diodes to vary the impedance thereof and the attenuation of said variable attenuator, the attenuating range of said variable attenuator being substantially determined by said limiting resistors and said capacitors being such that the frequency response of the attenuator is the same at each extremity of the attenuating range.

6. A wide-band automatic gain-controlled transistor amplifier comprising a plurality of transistor amplifying stages each having input and output terminals, a plurality of variable attenuators each arranged between an adjacent pair of said amplifying stages, each connected between the output of the preceding stage and the input of the following stage, and each having at least one arm containing a non-linear element and a resistance capacitor network presenting substantially the same frequency response at the minimum and maximum attenuation levels of said attenuator; and signal level detecting means connected from the output of the last one of said stages to one side of each non-linear element for increasing the attenuation of each attenuator in accordance with the output from said last stage, the attenuation introduced by the attenuator last in the direction of transmission being increased from its minimum to its maximum with increasing signal level and the attenuation introduced by each successive preceding attenuator being increased from its minimum to its maximum with further increase in signal level whereby at any given signal level only one of the attenuators is operative to vary the gain.

References Cited by the Examiner

UNITED STATES PATENTS

| | | | |
|---|---|---|---|
| 2,547,703 | 4/1951 | Hermont et al. | |
| 2,830,242 | 4/1958 | Darling | 330—21 X |
| 2,930,987 | 3/1960 | Groce et al. | 330—136 |
| 3,119,077 | 1/1964 | Saari | 330—145 |
| 3,069,552 | 12/1962 | Thomson | 330—183 X |
| 3,119,077 | 1/1964 | Saari | 330—145 |

ROY LAKE, *Primary Examiner.*

NATHAN KAUFMAN, *Examiner.*